US006537904B1

(12) United States Patent
Ishizuka

(10) Patent No.: US 6,537,904 B1
(45) Date of Patent: Mar. 25, 2003

(54) METHOD FOR MANUFACTURING A SEMICONDUCTOR DEVICE HAVING A FLUORINE CONTAINING CARBON INTER-LAYER DIELECTRIC FILM

(75) Inventor: Shuichi Ishizuka, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/658,675

(22) Filed: Sep. 8, 2000

Related U.S. Application Data

(63) Continuation of application No. PCT/JP99/05915, filed on Oct. 26, 1999.

(30) Foreign Application Priority Data

Oct. 26, 1998 (JP) .......................................... 10-321288

(51) Int. Cl.⁷ .............................................. H01L 21/44
(52) U.S. Cl. ........................ 438/623; 438/738; 438/622; 438/737
(58) Field of Search ................................ 438/622–629, 438/736–740; 257/642

(56) References Cited

U.S. PATENT DOCUMENTS

| 5,801,094 A | * | 9/1998 | Yew et al. .................. 438/624 |
| 5,817,572 A | * | 10/1998 | Chiang et al. .............. 438/624 |
| 6,127,258 A | * | 10/2000 | Watanabe et al. ........... 438/625 |
| 6,228,757 B1 | * | 5/2001 | Sengupta et al. ........... 438/622 |
| 6,232,235 B1 | * | 5/2001 | Cave et al. ................. 438/715 |

FOREIGN PATENT DOCUMENTS

| JP | 3-159124 | * | 7/1991 | .......... H01L/21/31 |
| JP | 4165623 | * | 6/1992 | .......... H01L/21/318 |
| JP | 4-288833 | | 10/1992 | |
| JP | 7-283312 | | 10/1995 | |
| JP | 9-246242 | | 9/1997 | |
| JP | 9-326388 | | 12/1997 | |
| JP | 10-112503 | | 4/1998 | |
| JP | 10-150105 | | 6/1998 | |

\* cited by examiner

*Primary Examiner*—Tom Thomas
*Assistant Examiner*—Ori Nadav
(74) *Attorney, Agent, or Firm*—Finnegan, Henderson, Farabow, Garrett & Dunner LLP

(57) ABSTRACT

When a semiconductor device using fluorine-containing carbon films (CF films) 21, 22, 23 as inter-layer dielectric films is fabricated using boron nitride films (BN films) as hard masks 31, 32, 33, total inter-wiring capacitance of the semiconductor device can be made low. After a first CF film 21 as an inter-layer dielectric film is stacked, a hard mask 31 composed of a BN film is stacked on the CF film 21, and thereafter selectively removed by etching to form a predetermined groove pattern. The CF film 21 is next etched by using the hard mask 31 as a mask to form grooves for forming wiring layers 51. Then, Cu is buried into the grooves to complete the semiconductor device. Since this semiconductor device uses the CF film and the MN film having low relative dielectric constants, the relative dielectric constant of the entire semiconductor device can be made low. As a result, its total inter-wiring capacitance can be made low as well.

5 Claims, 10 Drawing Sheets

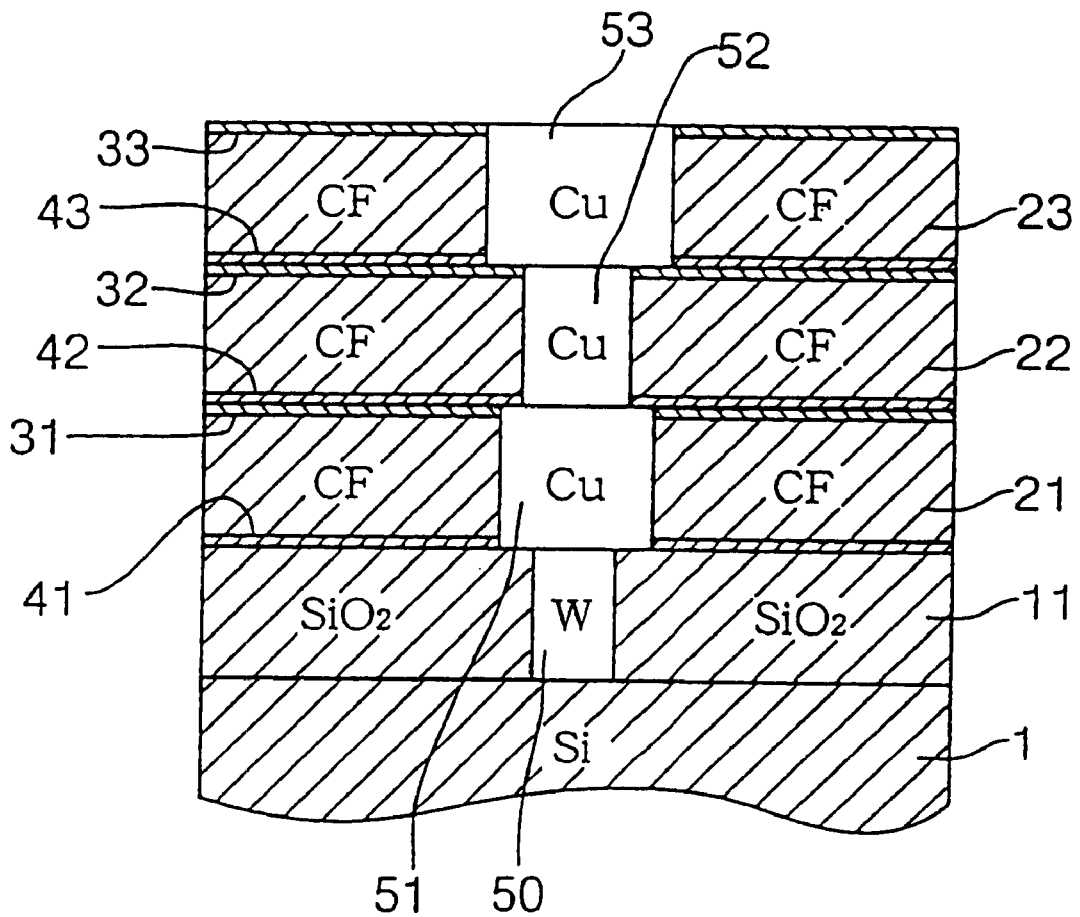
F I G. 1

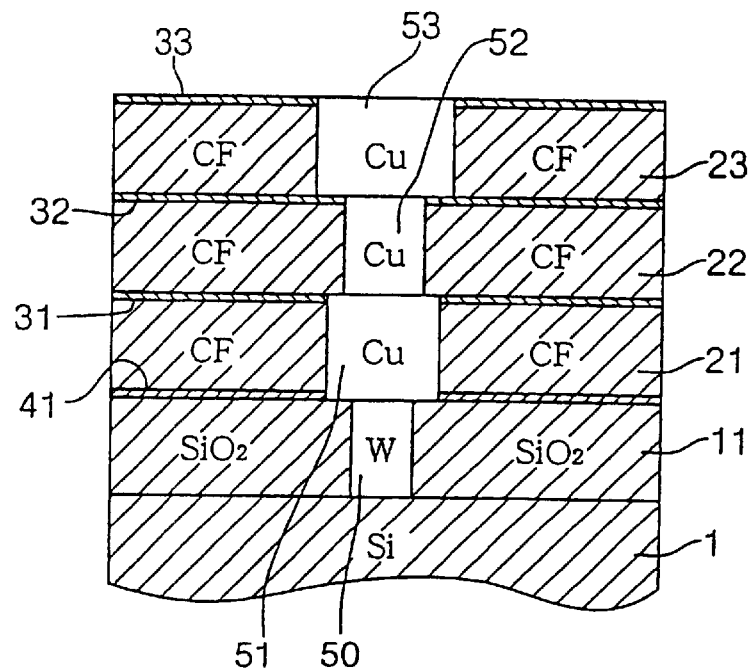
F I G. 7
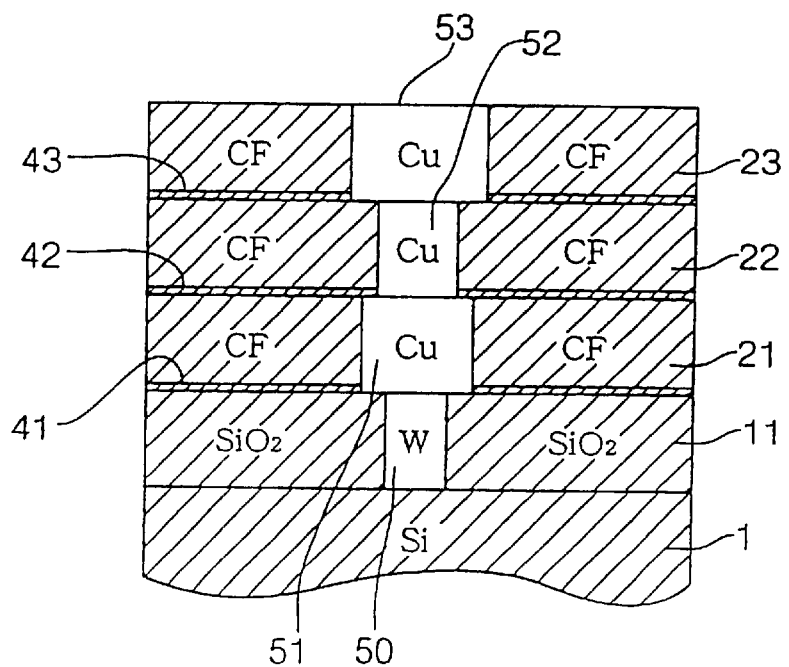
F I G. 8

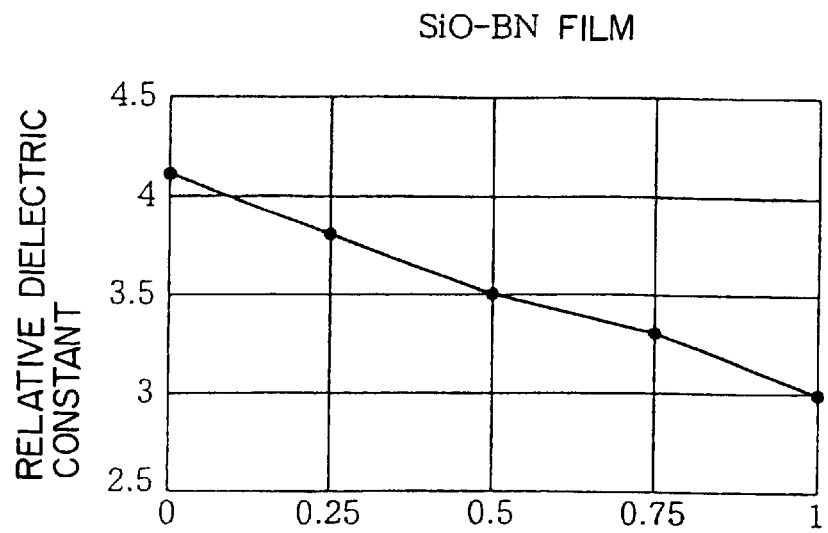
F I G. 9
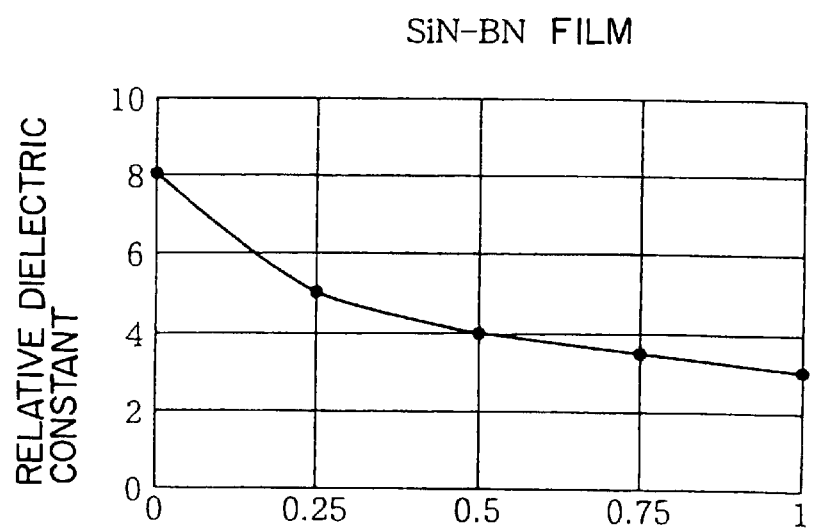
F I G. 10

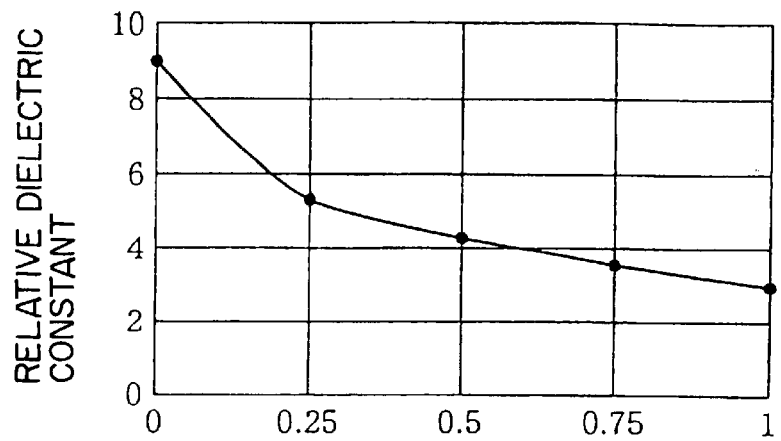
F I G. 11
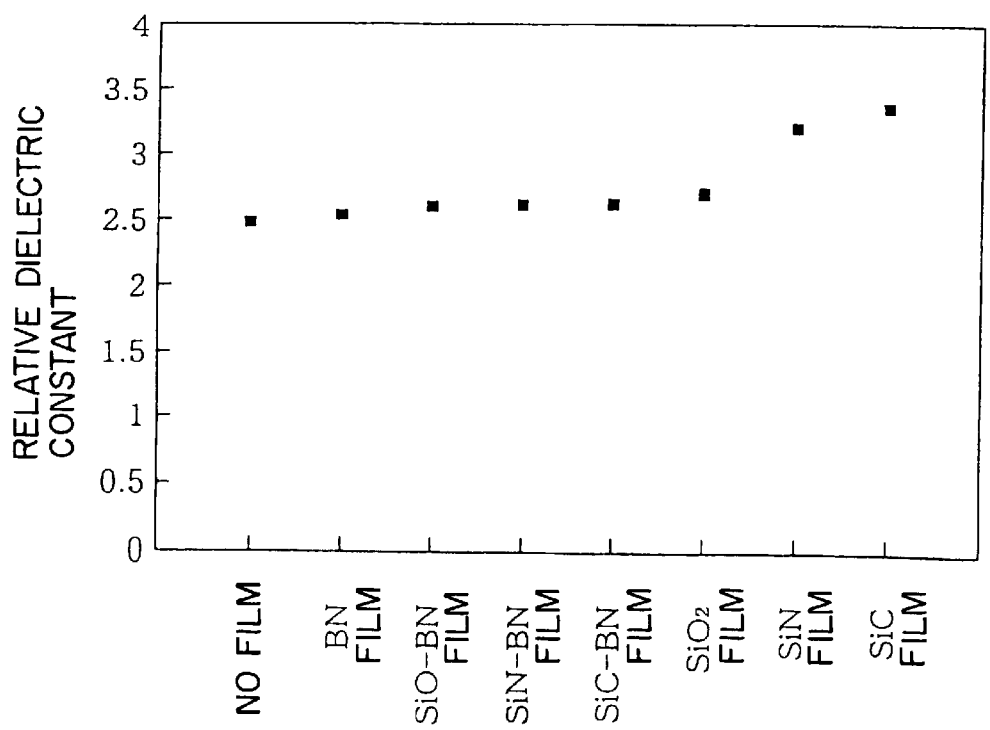
F I G. 12

| | |
|---|---|
| POLYIMIDE | $-\left(R_1-N\genfrac{}{}{0pt}{}{CO}{CO}R_2\genfrac{}{}{0pt}{}{CO}{CO}N\right)_n-$ |
| FLUORINE-CONTAINING POLYIMIDE | $-\left(R_1-\underset{CF_3}{\overset{CF_3}{C}}-R_1-N\genfrac{}{}{0pt}{}{CO}{CO}R_2-\underset{CF_3}{\overset{CF_3}{C}}-R_2\genfrac{}{}{0pt}{}{CO}{CO}N\right)_n-$ |
| POLYALLYLETHER FLUORIDE | (structure with fluorinated biphenyl ether) |
| FLUORINE-CONTAINING POLY-P-XYLYLENE | $-\left(CF_2-\bigcirc-CF_2\right)_n-$ |
| POLYTETRAFLUORO-ETHYLENE | $-\left(CF_2-CF_2\right)_m-\left(\genfrac{}{}{0pt}{}{-CF-CF-}{O-C-O}\genfrac{}{}{0pt}{}{}{CF_3-CF_3}\right)_n-$ |
| PERFLUOROCYCLO-POLYMER | $-\left(CF_2-CF\genfrac{}{}{0pt}{}{(CF_2)_x}{(CF_2)_y}CF-(CF_2)_x\right)_n-$ |

FIG. 13

METHOD FOR MANUFACTURING A SEMICONDUCTOR DEVICE HAVING A FLUORINE CONTAINING CARBON INTER-LAYER DIELECTRIC FILM

CROSS REFERENCE TO RELATED APPLICATION

This application is a Continuation of International Application No. PCT/JP99/05915, filed Oct. 26, 1999.

TECHNICAL FIELD

This invention relates to a semiconductor device using a fluorine-containing carbon film as an inter-layer dielectric film, and a manufacturing method thereof.

BACKGROUND ART

Various efforts, such as miniaturization of patterns and employments of multi-layered structure of circuits are being made toward progressively high integration of semiconductor devices. There is a technique for making wirings in the form of a multi-layered structure as one of those efforts. In order to employ a multi-layered structure, an n-th wiring layer and an (n+1)-th wiring layer are connected by a conductive layer, and a thin film called an inter-layer dielectric film is formed in the area excluding the area of the conductive layer.

$SiO_2$ film is a representative inter-layer dielectric film. Recently, however, it has been desired to lower relative dielectric constants of inter-layer dielectric films for the purpose of further increasing operation speeds of devices, and researches are being made about materials of inter-layer insulating films. That is, the relative dielectric constant of a $SiO_2$ film is about 4, and efforts are being made to find out materials having lower relative dielectric constants. Among them, a SiOF film whose relative dielectric constant is 3.5 is under progress toward realization, but the inventor is remarking boron nitride (BN) films containing boron (B) and nitrogen (N) and fluorine-containing carbon (CF) films which are lower in relative dielectric constant.

It has been confirmed that BN films have a high adhesiveness and are suitable for use as inter-layer insulating films in that respect, but they exhibit a high hygroscopicity and are thereby changed in relative dielectric constant Some trials including addition of silicon (Si) were made for improvement in that point. However, although addition of Si certainly decreases the hygroscopicity, it undesirably increases the relative dielectric constant. Therefore, BN films are difficult to realize for practical use, and the target has been directed to realization of semiconductor devices using CF films as their inter-layer insulating films.

Manufacturing processes of semiconductor devices, in general, include a process of etching an inter-layer dielectric film for the purpose of making a wiring layer by burying a metal therein. Since both a resist and a CF film are organic films that are approximately equal in etching rate (selectivity), the resist is also etched undesirably when the CF film is etched. To deal with this problem, a film of a material different in etching rate from the CF film is formed between the resist and the CF film as a hard mask before the etching is executed.

Used as the hard mask is a silicon carbide (SiC) film or a silicon nitride (SiN) film. A reason for the use of these films lies in that, although CF films are liable to lose fluorine (F) when heated, SiC and SiN are similar to ceramics, and have a high weather-resistance to fluorine.

However, when a SiC film, for example, is used as the hard mask, a semiconductor device having a multi-layered wiring structure made by stacking CF films results in having a considerably high relative dielectric constant as a whole, since SiC films and SiN films have relative dielectric constants as large as approximately 8. This invites the problems: an increase of the inter-wiring capacitance in the entire semiconductor device; a signal delay upon sending a digital signal; and a slow-down of the transmission rate of the signal.

The invention has been made under these circumstances, and its object lies in decreasing the total inter-wiring capacitance in a semiconductor device using a fluorine-containing carbon film, or the like, as its inter-layer insulating film.

DISCLOSURE OF INVENTION

For accomplishing the above-indicated object, according to the invention, there is provided a semiconductor device having a multi-layered wiring structure, comprising a plurality of wiring layers made of a metal, a dielectric layer provided between every adjacent two of said wiring layers, and a compound layer which is composed of a compound containing boron and nitrogen and is located at least on one side of said dielectric layer.

Additionally, according to the invention, there is provided a manufacturing method of a semiconductor device having a multi-layered wiring structure, comprising the steps of forming a dielectric layer, forming a compound layer composed of a compound containing boron and nitrogen, on said dielectric layer, forming a predetermined pattern on said compound layer using a resist composed of an organic material, and etching said dielectric layer to shape it into a predetermined pattern using an etching gas capable of etching both said dielectric layer and said resist.

BRIEF DESCRIPTION OF DRAWINGS

FIG. 1 is a sectional view that shows a semiconductor device according to the invention;

FIG. 7 is a sectional view that shows another semiconductor device according to the invention;

FIG. 8 is a sectional view that shows a further semiconductor device according to the invention;

FIG. 9 is a characteristic diagram that shows a relation between flow ratios of film-forming gases of a SiO—BN film and relative dielectric constants;

FIG. 10 is a characteristic diagram that shows a relation between flow ratios of film-forming gases of a SiN—BN film and relative dielectric constants;

FIG. 11 is a characteristic diagram that shows a relation between flow ratios of film-forming gases of a SiC—BN film and relative dielectric constants;

FIG. 12 is a characteristic diagram that shows a relation between materials of a hard mask of the semiconductor device and relative dielectric constants; and FIG. 13 is a diagram showing a specific example of an inter-layer insulating film.

BEST MODE FOR CARRYING OUT THE INVENTION

Figure 2:
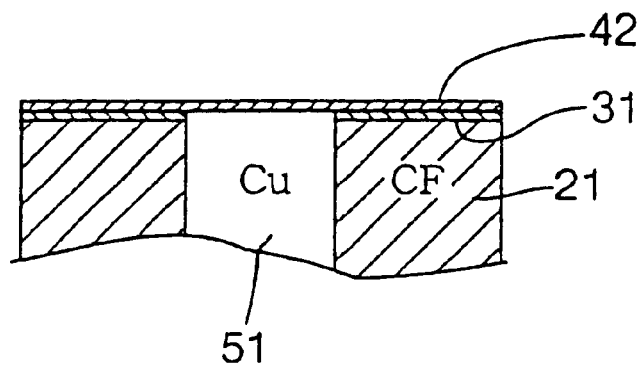
FIGS. 2(a) through 2(c) are diagrams that serially show steps of a manufacturing method of the semiconductor device.
Figure 2:
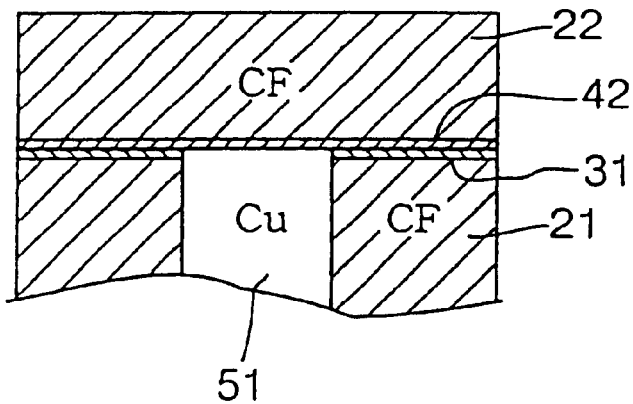
Figure 2:
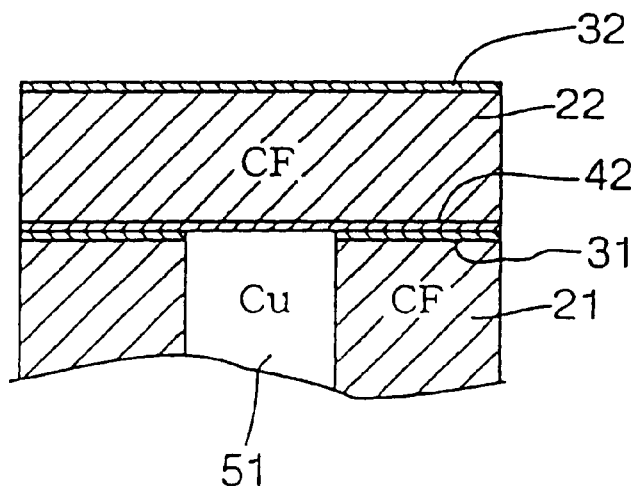
Figure 3:
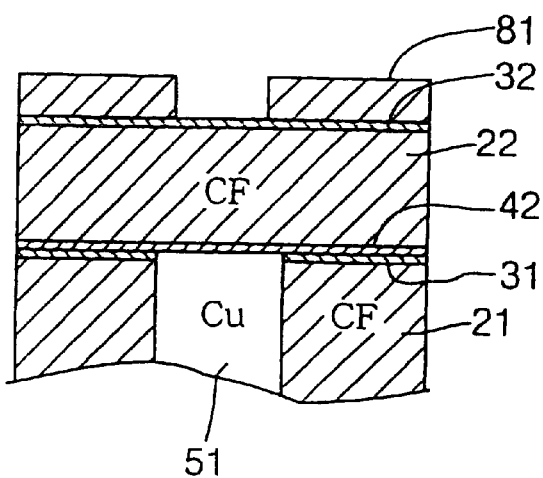
FIGS. 3(a) through 3(c) are diagrams that serially show subsequent steps of the manufacturing method of the semiconductor device.
Figure 3:
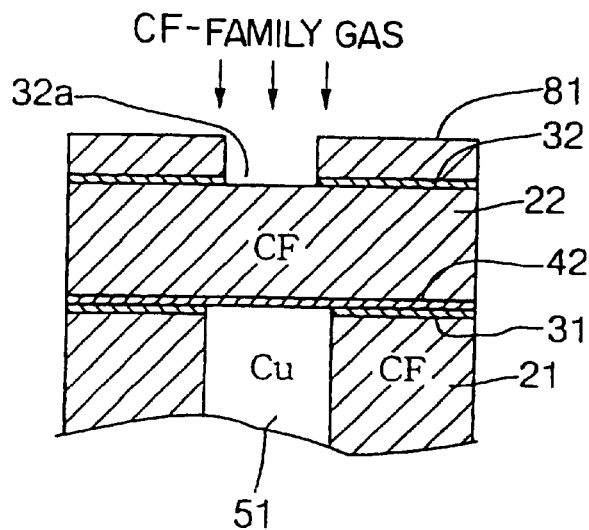
Figure 3:
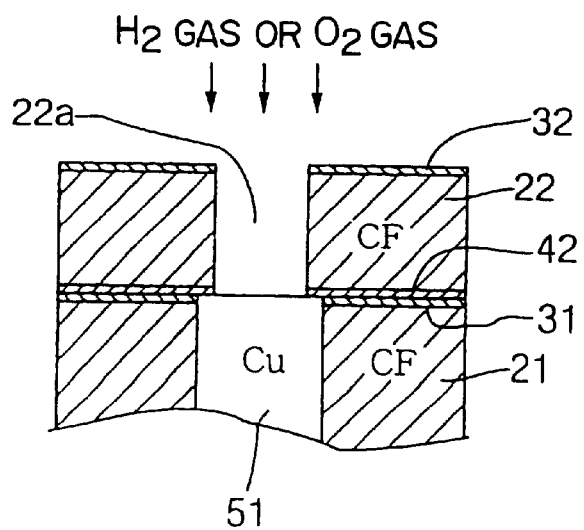
Figure 4:
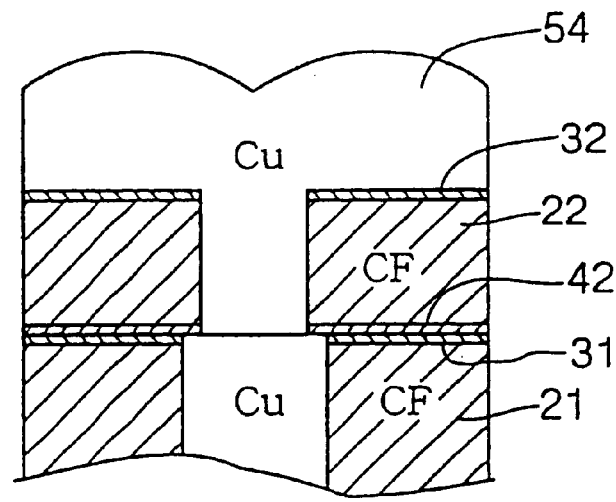
FIGS. 4(a) and 4(b) are diagrams that serially show subsequent steps of the manufacturing method of the semiconductor device.
Figure 4:
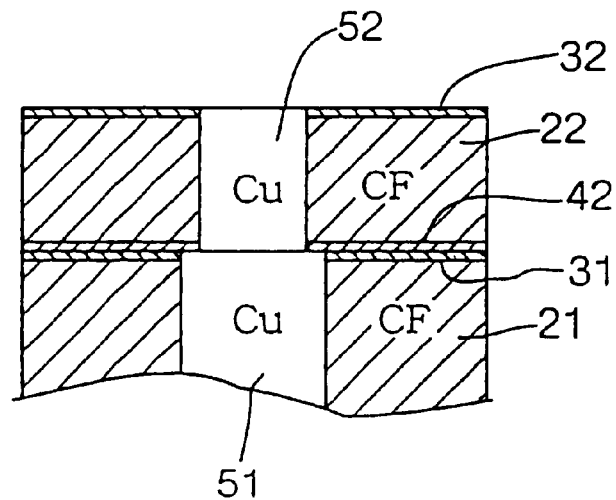

A structure of a semiconductor device according to the invention will first be described with reference to FIG. 1. In the figure, numeral 1 denotes a silicon (Si) substrate. Formed on its surface is a silicon dioxide film ($SiO_2$ film) 11 as an insulating layer, and stacked on its surface are inter-layer insulating or dielectric films composed of first to third fluorine-containing carbon films (CF films) 21, 22, 23 each having a thickness of approximately 10,000 angstroms, for example. On top surfaces of the CF films 21, 22, 23, hard masks 31, 32, 33 each with a thickness around 500 to 1000 angstroms, for example, are provided respectively, and adhesive layers 41, 42, 43, which are 40 to 50 angstrom thick, for example, are formed between the $SiO_2$ film 11 and the first CF film 21, between the hard mask 31 and the CF film 22, and between the hard mask 32 and the CF film 23, respectively. Further formed in the CF films 21, 22, 23 are wiring layers 51, 52, 53 of a metal such as copper (Cu), respectively (the wiring layer 52 being a connection line of the wiring layers 51 and 53), and a connection line 50 made of tungsten (W) and connecting those wiring layers $SiO_2$ film is formed in the $SiO_2$ film 11.

Since $O_2$ or $H_2$ gas is used as an etching gas for etching the CF film, a resist made of an ordinary organic material will be ashed by the gas, and cannot be used as masks. Therefore, the hard masks 31, 32 and 33 described above are used as masks instead of resists during etching. Accordingly, an inorganic material which is not ashed by $O_2$ or $H_2$ gas is selected as the material of the hard masks 31, 32 and 33. In the present invention, the hard masks 31, 32 and 33 are composed of films that include a compound containing boron (B) and nitrogen (N) (hereinafter referred to as "BN-family film"), such as boron nitride film (hereinafter referred to as "BN film").

The adhesive layers 41, 42 and 43 are films interposed between the $SiO_2$ 11 and the first CF film 21, and between the hard masks 31, 32 and the CF films 22, 23 for the purpose of preventing separation of these films. In this example, they are silicon nitride films containing a significant quantity of Si, for example. The CF film and BN film referred to in the present invention are not limited to those containing C and F or B and N in equal share by 1:1.

A manufacturing method of this type of semiconductor device will be described below in detail, taking an example where the CF film is formed on the top surface of another CF film with reference to FIGS. 2(a) to 4(b). First, an explanation will be made about an aspect of the first CF film 21. The CF film 21 includes a Cu wiring layer 51 buried therein, and the hard mask 31 that has been used when making the Cu wiring 51 is formed on the surface of the CF film 21. The Cu wiring layer 51 is buried by chemical vapor deposition, sputtering, plating or other appropriate technique.

Referring first to FIG. 2(a), the hard mask 31 is formed on the surface of the first CF film 21, followed by a process of forming the adhesive layer 42 for preventing separation of the second CF film 22 from the first CF film 21. The adhesive layer 42 is made of silicon nitride (SiN) containing a significant quantity of Si as mentioned above, and it is applied by generating plasma from the film-forming gas in a plasma processing system using ECR (electron cyclotron resonance), for example.

A brief explanation will be made about the plasma processing system with reference to FIG. 5. This system has a vacuum vessel 6 including a first vacuum chamber 61 and a second vacuum chamber 62, and a radio-frequency wave (microwave) of 2.45 GHz, for example, is supplied into the vacuum vessel 6 from a radio-frequency power source 63 through a wave guide 64 and a transmission window 65. At the same time, a magnetic field, orienting from the first vacuum chamber 61 to the second vacuum chamber 62 and having the intensity of 875 gausses near an ECR point P, is generated by a main electromagnetic coil 66 around the first vacuum chamber 61 and an auxiliary electromagnetic coil 67 under the second vacuum chamber 62. Thus, electron cyclotron resonance occurs at the ECR point P due to interaction between the magnetic field and the microwave.

For making a $SiO_2$ film by using this system, a substrate or a semiconductor wafer W is put on a mounting table 71 located in the second vacuum chamber 62 and having an upper surface configured to function as an electrostatic chuck, and a bias voltage is applied to the mounting table 71 from the radio-frequency power source 72. Then, while evacuating the vacuum vessel 6 through an exhaust pipe 68, a plasma gas such as Ar gas, for example, is introduced into the first vacuum chamber 61 through a plasma gas supply pipe 73 at the flow rate of 150 sccm. At the same time, film-forming gases such as $SiH_4$ gas and $O_2$ gas, for example, are introduced into the second vacuum chamber 62 through a film-forming gas supply section 74 in flow rates of 75 and 103 sccm, respectively, and under the condition that the microwave electric power (radio-frequency power source 63) is set at 2.7 kW, the bias electric power (radio-frequency power source 72) is set at 1.5 kW and wafer temperature is set at 350° C., the film-forming gases are changed to plasma by electron cyclotron resonance to thereby stack the $SiO_2$ film.

Next, as shown in FIG. 2(b), a process of forming the second CF film 22 on the surface of the adhesive layer 42 is executed. The CF film 22 is formed in the plasma processing system, for example, by introducing a plasma gas such as Ar gas and film-forming gases such as $C_4F_8$ and $C_2H_4$ gases in flow rates of 150 sccm, 40 sccm and 30 sccm, respectively, and changing the film-forming gases into plasma under the microwave power of 2.7 kW and the bias power of 1.5 kW.

Next, as shown in FIG. 2(c), a process of making a hard mask on the surface of the second CF film 22 is executed. The hard mask 32 is a BN film as already explained. The hard mask 32 is made by introducing a plasma gas such as Ar gas, and film-forming gases such as $BF_3$ and $N_2$ gases in the flow rates of 50 sccm and 40 sccm, respectively, and by changing the film-forming gases into plasma in the conditions that the microwave electric power is set at 2.5 kw and the bias power is set at 1.0 kW, respectively. After that, a process of making the Cu wiring layer 52 (FIG. 1) in the second CF film 22 is executed. That is, as shown in FIG. 3(a), a resist 81 is applied on the surface of the hard mask 32, a predetermined groove pattern is exposed and developed on the resist 81, and, as shown in FIG. 3(b), a compound gas (hereinafter called a "CF-family gas"), such as $CF_4$ gas or $C_4F_8$ gas, containing carbon (C) and fluorine (F) is used as the etching gas, to form a groove 32a in the hard mask 32 by etching in an etching system, not shown. Subsequently, as shown in FIG. 3(c), using $O_2$ or $H_2$ gas as the etching gas and using the hard mask 32 as a mask, a groove 22a for making the buried wiring layer 52 (FIG. 1) of Cu in the CF film 22 is made by etching. At that time, the resist 81 is removed by ashing by $O_2$ or $H_2$ gas as apparent from FIG. 3(c).

Since the adhesive layer 42 underlying the CF film 22 is as thin as 40 to 50 angstroms, it is also removed by etching by fluorine (F) generated from the CF film 22 during etching of the groove 22a as shown in FIG. 3(c). It is also possible to execute another step of cleaning the groove 22a to thereby remove the adhesive layer 42. As the cleaning gas is used a CF-family gas such as $C_4F_8$ gas or $CF_4$ gas, for example.

After that, a process of burying a metal like Cu in the groove 22a is performed as shown in FIG. 4(a). More specifically, as shown in FIG. 4(a), after stacking a copper (Cu) layer 54 on the surface of the hard mask 32 by chemical vapor deposition, sputtering or plating, for example, and then burying Cu in the groove 22a, a CMP (chemical mechanical polishing) process is conducted in a CMP apparatus, not shown, to remove the undesired part of the Cu layer 54 by polishing. As a result, the semiconductor device with buried Cu in the groove 22a is obtained.

The semiconductor device according to the invention has been made as a result of reviews by the inventor about properties of various insulating films having low relative dielectric constants, which resulted in finding that CF films were suitable for use as inter-layer insulating films and finding that BN-family films had properties required for materials of hard masks of CF films, namely, difference in etching rate from CF films, hardness, adhesive force to CF films, and so on.

As reviewed above, a BN film suitable as a hard mask is used in the semiconductor device according to the invention during etching of the CF film, and for this reason the CF film can be etched accurately. Additionally, an insulating film with a low relative dielectric constant is used as an inter-layer insulating film or a hard mask in the semiconductor device, the relative dielectric constant of the entire semiconductor device can be lowered significantly. As a result, inter-wiring capacitance can be decreased as a whole, and the signal transmission rate can be improved.

Figure 6:
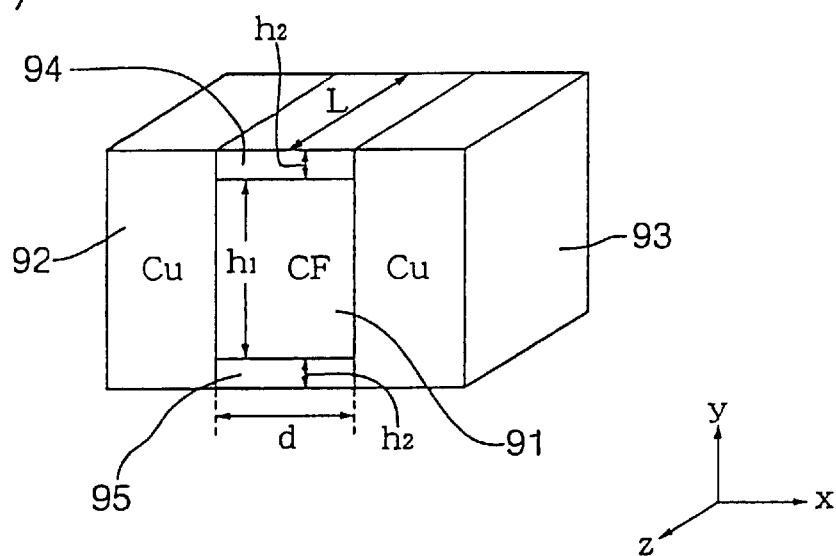
FIG. 6(a) is an explanatory diagram that shows a model used for calculating relative dielectric constant of the semiconductor according to the invention.
FIG. 6(b) is an explanatory diagram that shows a model used for calculating relative dielectric constant of a comparative example.
Figure 6:
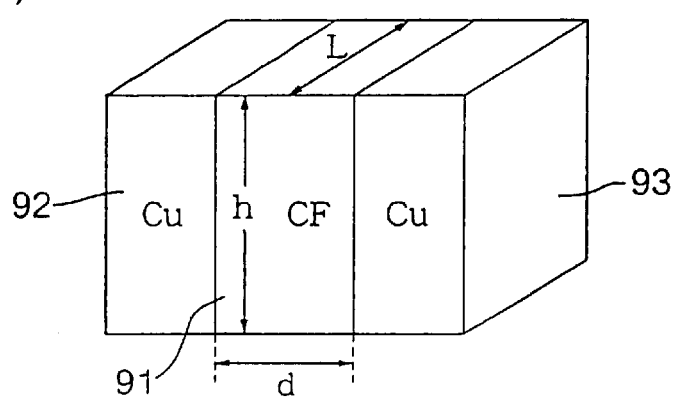

Actual calculation of dielectric constants of semiconductor devices according to the invention and semiconductor devices using SiC or SiN films as hard masks resulted as follows. In this calculation, semiconductor device models having the configuration shown in FIGS. 6(a) and 6(b) were used. FIG. 6(a) shows a semiconductor device model having a hard mask, while FIG. 6(b) shows a semiconductor device model not having a hard mask. In FIG. 6(b), 91 refers to a CF film as an inter-layer insulting film, 92 and 93 to Cu wiring layers, and 94 and 95 to hard masks.

Inter-wiring capacitance $C_1$ of the semiconductor device having no hard mask is calculated by Equation (1) below.

$$C_1 = \in_1 \in_0 hL/d \tag{1}$$

where $\in_1$ is the dielectric constant of the CF film 91, $\in_0$ is the dielectric constant in a vacuum space, d is the length of the CF film 91 in the x-direction, h is the length of the CF film 91 in the y-direction, L is the length of the CF film 91 in the z-direction. Since $\in_0$, d, h and L are given, it can be said that the inter-wiring capacitance $C_1$ is proportional to $\in_1$.

On the other hand, inter-wiring capacitance $C_2$ of the semiconductor device having a hard mask is calculated by Equation (2) as follows:

$$C_2 = \in_1 \in_0 h_1 L/d + 2 \in_2 \in_0 h_2 L/d = \in_3 \in_0 hL/d \tag{2}$$

where, $\in_2$ is dielectric constants of hard masks 94 and 95, $h_1$ is the length of the CF film 91 in the y-direction, and $h_2$ is the length of the hard masks 94 and 95 in the y-direction. Assuming that $E_3$ is the total relative dielectric constant of the CF film 91 and the hard masks 94 and 95, it can be said that the inter-wiring capacitance $C_2$ is proportional to $\in_3$.

Therefore, between the inter-wiring capacitances $C_1$ and $C_2$, there is the following relation.

$$C_1:C_2 = \in_1:\in_3 \tag{3}$$

Therefore, from Equation (1) and Equation (3), relative dielectric constant $\in_3$ is calculated by the following Equation (4).

$$\in_3 = C_2 \in_1/C_1 = (\in_1 h_1 + 2 \in_2 h_2)/h \tag{4}$$

Taking a semiconductor device using a BN film as a hard mask, having 8000 angstroms as h, 6000 angstroms as $h_1$, and 500 angstroms as $h_2$, its relative dielectric constant $\in_3$ is calculated. Since $\in_1$ is 2.5 and $\in_2$ is 4.0, $\in_3$ becomes 2.7. On the other hand, calculation of relative dielectric constant $\in_3$ in the case of using a SiC film or SiN film as the hard mask material results in 3.2 since $\in_2$ is 8.0.

It is understood from the above calculation result that relative dielectric constant of the entire semiconductor device can be lowered by lowering the relative dielectric constant of the hard mask material, and that, because of the proportional relationship between the inter-wiring capacitance and relative dielectric constant, the inter-wiring capacitance of the entire semiconductor device can be decreased.

In this case, BN films have undesirable hygroscopicity as their drawback as already indicated, but the hard mask as thin as approximately 500 to 1000 angstroms, which is much thinner than the inter-layer insulating film, changes in relative dielectric constant due to the hygroscopicity do not adversely affect the natures of the devices so much.

Further, since the above-explained semiconductor device has the cu wiring layer formed in the CF film as the inter-layer insulating film, it is required to minimize adverse effects derived from diffusion of Cu into the CF film, namely, junction leakage of the device, dielectric breakdown of the gate oxide film, fluctuation of MOS threshold voltage and other adverse effects to the semiconductor device. In the above-explained example, however, the surface of the CF film 2 is covered with hard masks 31, 32, 33 made of BN difficult for Cu to diffuse into, diffusion of Cu into the CF film is prevented by the BN film, and the semiconductor device is improved in reliability.

Furthermore, the BN. films as the hard masks 31, 32, 33 on the CF films 21, 22, 23 also contribute to the effects of preventing F, CF, $CF_2$ or $CF_3$, for example, from leaving the CF films 21, 22 and 23. When a CF film is heated to a high temperature, part of C—F bonds is disconnected and the F-family atoms mentioned above are going to leave. In this case, however, the F-family atoms cannot pass through the hard masks 31, 32, 33, which results in preventing the F-family atoms from leaving. As a result, it is possible to prevent various problems caused by the leaving of the F-family atoms, namely, corrosion of metal wirings, generation of electric defects called electro-migration, deterioration of insulation between wirings caused by cracks in the insulating film, increase of the relative dielectric constant, and so on.

In the semiconductor device explained above, the hard masks 31, 32, 33 and the adhesive layers 41, 42, 43 are provided individually. However, the adhesive layers may be omitted as shown in FIG. 7. Even without the adhesive layers, adhesive force between a BN film and a CF film is as large as satisfying the relation of "SiO film<SiN film<SiC film or BN film", and the hard masks 31, 32, 33 function as adhesive layers to thereby prevent separation between the CF films 21, 22, 23 and the hard masks 31, 32, 33.

Further, in the present invention, the hard mask may be removed by CPM (Chemical Mechanical Polishing) as shown in FIG. 8. In this case, the hard masks bind the CF film with a large adhesive force as stated above, so that an additional effect, i.e. an increase of the etching accuracy, is obtained. Furthermore, in the present invention, taking advantage of the large adhesive force between BN films and CF films, BN films may be used as adhesive layers. In this case, the use of insulating films with low relative dielectric constants as inter-layer insulating films and adhesive layers contributes to decreasing the relative dielectric constant of the entire semiconductor device.

As reviewed above, it is effective to use BN-family films as hard mask materials and adhesive layers. In addition to BN films, SiO—BN films having a relative dielectric constant around 3 to 4, SiN—BN films having a relative dielectric constant around 3 to 8, SiC—BN films having a relative dielectric constant around 3–8, and others may be used as BN-family films. These SiO—BN films, SiN—BN films and SiC—BN films are composite materials of BN films and si-family films containing Si, and the use of these films contributes to improvement of the waterproofing quality.

Figure 5:
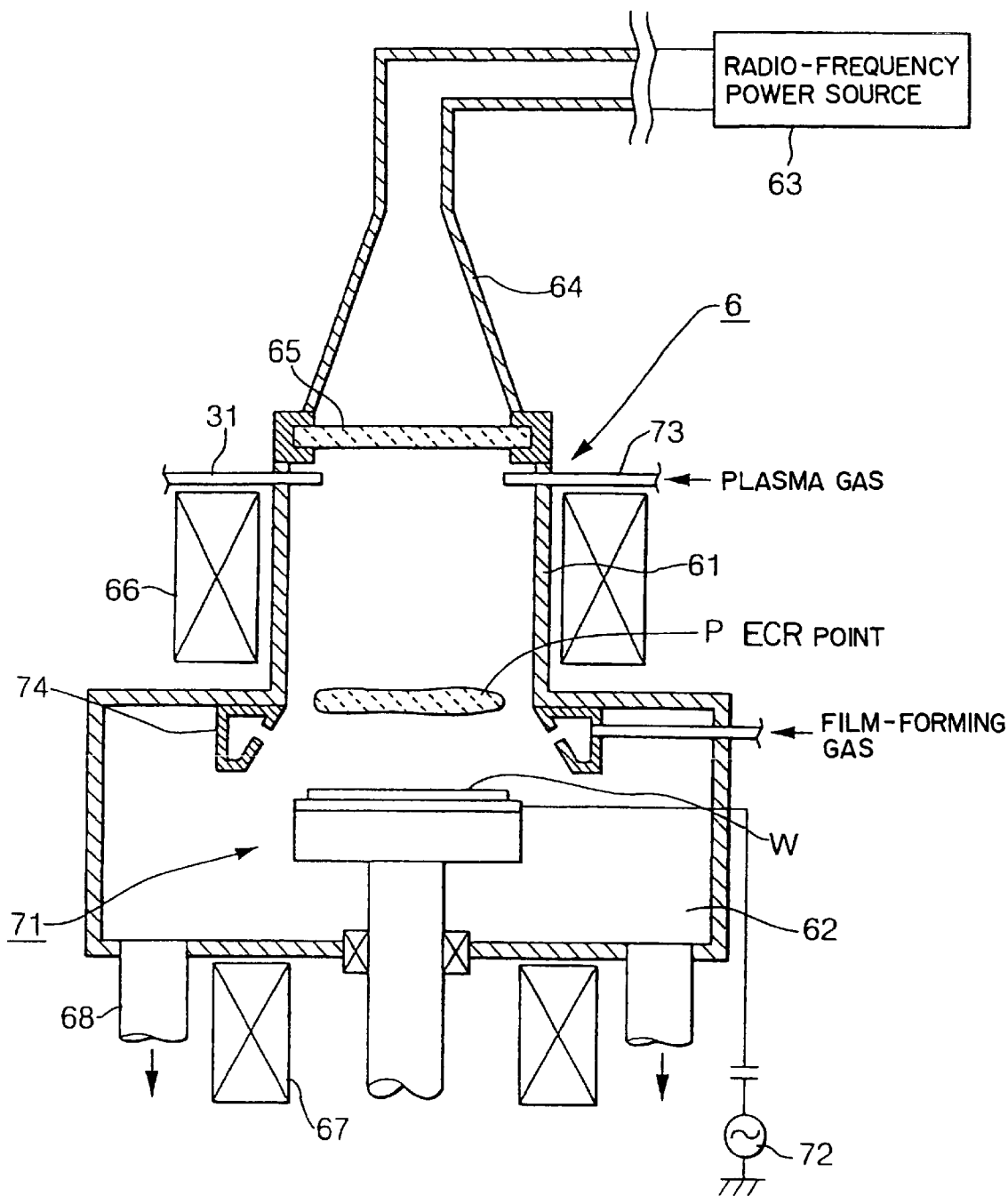
FIG. 5 is an elevational view, in vertical section, that shows a plasma processing system used when making an inter-layer insulating film of the semiconductor device.

The SiO—BN films and other like materials mentioned above are made by plasma CVD (chemical vapor deposition) at a temperature around 400° C. in the plasma processing system shown in FIG. 5. In this case, SiO—BN films are formed by exciting film-forming gases for SiO films and film-forming gases for BN films into plasma. For example, a combination of $SiH_4$ gas, $O_2$ gas, $BF_3$ gas and $N_2$ gas or a combination of $SiH_4$ gas, $O_2$ gas, $B_2H_6$ gas and $MH_3$ gas is used for the film deposition. SiN—BN films are made by exciting film-forming gases for SiN films and film-forming gases for BN films into plasma. For example, a combination of $SiH_4$ gas, $BF_3$ gas and $N_2$ gas or a combination of $SiH_4$ gas, $B_2H_6$ gas and $NH_3$ gas is used for the film deposition. SiC—BN films are made by exciting film-forming gases for SiC films and film-forming gases for BN films into plasma. For example, a combination of $SiH_4$ gas, $C_2H_4$ gas, $BF_3$ gas and $N_2$ gas or a combination of $SiH_4$ gas, $C_2H_4$ gas, $B_2H_6$ gas and $NH_3$ gas is used for the film deposition.

At that time, SiO—BN films can be adjusted in relative dielectric constant by changing the ratio between flow rates of the film-forming gases for Si-family films and the film-forming gases for BN films and thereby controlling the composition of the films. For example, when a SiO—BN film is formed by using a combination of the film-forming gases for SiO films, composed of $SiH_4$ gas and $O_2$ gas, and the film-forming gases for BN films, composed of $BF_3$ gas and $N_2$ gas, the relative dielectric constant can be adjusted, as shown in FIG. 9, within the range from 3 to 4.1 by changing the ratio of the flow rate of the film-forming gases for BN films with respect to the flow rate of all film-forming gases, defined by $(BF_3+N_2)/((SiH_4+O_2)+(BF_3+N_2))$. In FIG. 9, the gas flow rate ratio 0 indicates SiO films and the gas flow rate ratio 1 indicates BN films.

Similarly, in case of SiN—BN films, the relative dielectric constant varies in the range from 3 to 8 as shown in FIG. 10 when the ratio between the flow rate of the film-forming gases for SiN films, composed of $SiH_4$ gas and $N_2$ gas, and the flow rate of the film-forming gases for BN films, composed of $BF_3$ gas and $N_2$ gas is changed. Furthermore, in case of SiC—BN films, the relative dielectric constant varies in the range from 3 to 9 as shown in FIG. 11 when the ratio between the flow rate of the film-forming gases for SiC films, composed of $SiH_4$ gas and $C_2H_4$ gas, and the flow rate of the film-forming gases for BN films, composed of $BF_3$ gas and $N_2$ gas is changed.

Relative dielectric constants of semiconductor devices were actually calculated, taking those using hard masks of such materials, those without hard masks as comparative examples, and those using $SiO_2$ films, SiN films and SiC films as hard masks, and the result shown in FIG. 12 was obtained. In this case, relative dielectric constants of SiO—BN films, SiN—BN films, SiC—BN films and $SiO_2$ films were taken as 3.5, 3.55, 3.60 and 4.0, respectively.

From this result, it was recognized that, when composite materials composed of Si-family films and BN films were used as hard masks, relative dielectric constant was about 2.7, and this value was slightly higher than that of BN films but much lower than those of SiN films and SiC films. It was thus confirmed that those composite materials were also useful.

In the above examples, a combination of $BF_3$ gas and $NH_4$ gas, a combination of $B_2H_6$ gas and $N_2$ gas or a combination of $B_2H_6$ gas and $NH_3$ gas may be used as the film-forming gases for BN films. Further, BN films, SiO—BN films, SiN—BN films, SiC—BN films and other like films may be formed by thermal chemical vapor deposition instead of plasma chemical vapor deposition.

In addition to $C_4F_8$ gas, $C_4F_6$ gas, $C_5F_8$ gas, $C_6F_{10}$ gas and $C_6H_5CF_3$ gas are also usable as the film-forming gases for CF films used as inter-layer insulting films. CF films or BN films can be formed as well by using a system configured to generate plasma by using the technique called ICP (inductive coupled plasma) which applies an electric field and a magnetic field to processing gases from a coil wound on a dome-shaped vessel, for example, instead of the technique which generates plasma by ECR. Also usable for the film deposition are a system which generates plasma called helicon-wave plasma by interaction between helicon waves of 13.56 MHz, for example, and a magnetic field applied from a magnetic coil, a system which generates plasma called magnetron plasma by applying a magnetic field in parallel to two parallel cathodes, and a system which generates plasma by applying a radio-frequency electric power between a pair of confronting electrodes called parallel plates.

The foregoing embodiments have been explained as using fluorine-containing carbon films (CF films) as inter-layer insulating films. However, inter-layer insulating films with low relative dielectric constants used in the invention are not limited to the CF films. That is, also usable as inter-layer dielectric films are films made of polyimide, fluorine-containing polyimide, polyallylether fluoride, fluorine-containing poly-P-xylylene, Teflon (brand name of DuPont for polytetrafluoroethylene) or perfluorocyclopolymer, instead of CF films. Fluorine-containing poly-P-xylylene films are made by chemical vapor deposition, and other films are formed by coating. Structural formulas of compounds constituting these films are shown in FIG. 13.

As described above, according to the present invention, the semiconductor device can be made with a low relative dielectric constant, so that the inter-wiring capacitance of the whole semiconductor device can be decreased.

What is claimed is:

1. A manufacturing method of a semiconductor device having a multi-layered wiring structure, comprising the steps of:

forming a dielectric layer;

forming a compound layer of a composition containing boron, nitrogen, and silicon on said dielectric layer by changing a ratio of flowrates of a gas containing silicon, a gas containing boron, and a gas containing nitrogen, to determine the composition of the compound layer;

forming a predetermined pattern on said compound layer using a resist composed of an organic material; and etching said dielectric layer to shape it into a predetermined pattern using an etching gas capable of etching both said dielectric layer and said resist.

2. The manufacturing method of semiconductor device according to claim 1, further comprising, after said step of etching, a step of forming a wiring layer in said dielectric layer already etched into said predetermined shape.

3. The manufacturing method of semiconductor device according to claim 1, further comprising, after said step of forming a compound layer, a step of forming an adhesive layer containing silicon.

4. The manufacturing method of semiconductor device according to claim 1, wherein said step of forming a dielectric layer is executed by reduced-pressured deposition.

5. The manufacturing method of semiconductor device according to claim 1, wherein said step of forming a dielectric layer is executed by coating.

* * * * *